United States Patent [19]

Grangroth et al.

[11] Patent Number: 4,649,339
[45] Date of Patent: Mar. 10, 1987

[54] INTEGRATED CIRCUIT INTERFACE

[75] Inventors: Robert H. Grangroth, Osseo; Jerald M. Loy, Anoka, both of Minn.

[73] Assignee: Honeywell Inc., Minneapolis, Minn.

[21] Appl. No.: 603,860

[22] Filed: Apr. 25, 1984

[51] Int. Cl.⁴ .......................... G01R 31/02; G01R 1/06
[52] U.S. Cl. ................................. 324/158 F; 324/72.5; 324/73 PC; 324/158 P
[58] Field of Search ............... 324/158 P, 158 F, 72.5, 324/73 PC; 200/83 N; 339/117 P, 17 LM, 17 L, 17 C

[56] References Cited

U.S. PATENT DOCUMENTS

| | | | |
|---|---|---|---|
| 3,405,361 | 10/1968 | Kattner et al. | 324/158 P |
| 3,596,228 | 7/1971 | Reed, Jr. | 324/158 F |
| 3,688,064 | 8/1972 | Myers | 200/83 N |
| 4,065,717 | 12/1977 | Kattner et al. | 324/158 F |
| 4,189,825 | 2/1980 | Robillard et al. | 29/574 |
| 4,312,117 | 1/1982 | Robillard et al. | 29/591 |
| 4,340,860 | 7/1982 | Teeple, Jr. | 324/158 F |

Primary Examiner—Ernest F. Karlsen
Assistant Examiner—Vinh P. Nguyen
Attorney, Agent, or Firm—William T. Udseth

[57] ABSTRACT

Disclosed is an interface for testing an integrated circuit device through a plurality of contacts on an exposed surface of the device. The interface comprises a flexible sheeting having first and second opposing surfaces. A plurality of contacts are disposed on the first surface of the sheet in a pattern designed to mate with a plurality of contacts on an integrated circuit device. A plurality of thin film conductors are patterned on the sheet, the conductors each being connected to a contact on the sheet and being adapted for connection to a circuit for testing the device. The interface comprises apparatus for preforming into a generally domed shape a portion of the sheet which includes a plurality of the contacts and apparatus for flexing the flexible sheet so that the contacts on both the sheet and the device may be brought into intimate contact.

12 Claims, 5 Drawing Figures

U.S. Patent  Mar. 10, 1987  4,649,339
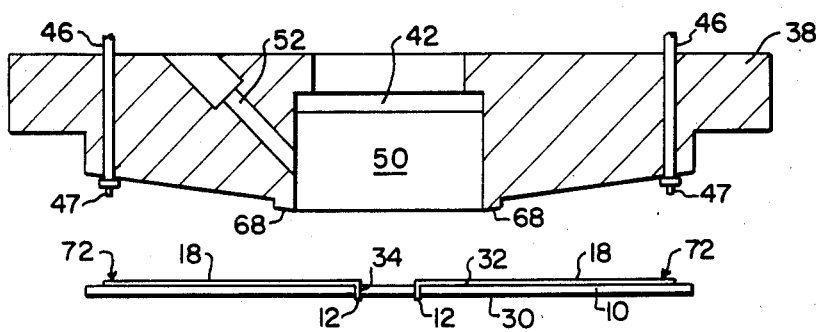
FIG. 1A
FIG. 1B
FIG. 1C
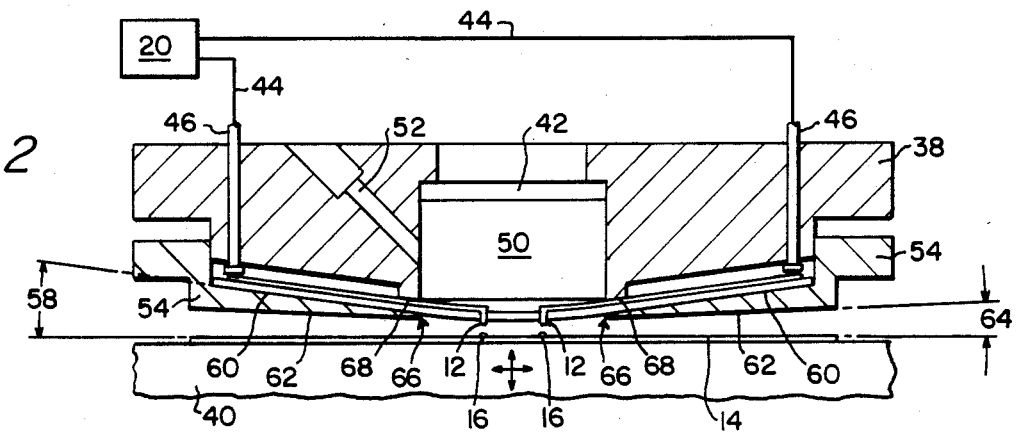
FIG. 2
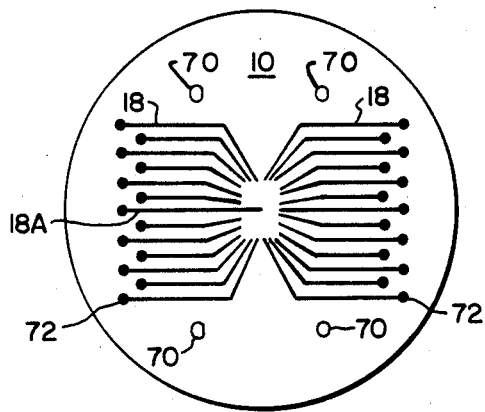
FIG. 3

INTEGRATED CIRCUIT INTERFACE

BACKGROUND OF THE INVENTION

The present invention relates to integrated circuit devices and more particularly to testers for testing integrated circuit devices.

Typical probe cards used in integrated circuit device testing are extremely complex and expensive and are easily damaged. With the present invention, this complexity and expense is substantially eliminated.

SUMMARY OF THE INVENTION

The present invention is an interface for testing an integrated circuit device through a plurality of contacts on an exposed surface of the device. The interface comprises a flexible sheeting having first and second opposing surfaces. A plurality of contacts are disposed on the first surface of the sheet in a pattern designed to mate with a plurality of contacts on an integrated circuit device. A plurality of thin film conductors are patterned on the sheet, the conductors each being connected to a contact on the sheet and being adapted for connection to a circuit for testing the device. The interface comprises apparatus for preforming into a generally domed shape a portion of the sheet which includes a plurality of the contacts and apparatus for flexing the flexible sheet so that the contacts on both the sheet and the device may be brought into intimate contact.

BRIEF DESCRIPTION OF THE DRAWINGS

FIGS. 1A, 1B and 1C illustrate part of an interface compatible with the present invention.

FIG. 2 illustrates an interface in accordance with the present invention.

FIG. 3 illustrates a flexible sheet compatible with the present invention.

DETAILED DESCRIPTION OF THE PREFERRED EMBODIMENTS

The present interface comprises a flexible sheet 10 having a first surface 30 and a second surface 32. A plurality of contacts 12 are disposed on first surface 30 of sheet 10 in a pattern designed to mate with a plurality of contacts 16 on integrated circuit device 14 which, for example, may comprise a chip or a wafer comprising die.

A plurality of thin film conductors 18 are patterned on sheet 10, the conductors each being connected to a contact 12 on sheet 10 and being adapted for connection to a circuit 20 for testing device 14.

The present interface further comprises apparatus for preforming into a generally domed shape a portion of sheet 10 which includes a plurality of contacts 12. The present interface further comprises apparatus 50 for flexing flexible sheet 10 so that contacts 12 and 16 on sheet 10 and device 14 respectively may be brought into intimate contact.

While not a necessity, it is typical to place conductors 18 and contacts 12 on the opposite surfaces of flexible sheet 10. Accordingly, as illustrated in FIG. 1B, contacts 12 are typically located on first surface 30 of flexible sheet 10, and conductors 18 are typically located on second surface 32 of flexible sheet 10, contacts 12 physically being connected to conductors 18 through a via 34 in flexible sheet 10.

Flexible sheet 10 may be fabricated through standard processing techniques. For example, one may start with a sheet of polyimide having copper film or foil laminated to surface 32, use a photoprocess to define etch traces 18 in the pattern desired, etch vias 34 from surface 30 through to traces 18 wherever a contact 12 is desired, electroplate a connection through each via 34 from the corresponding conductor 18 to surface 30, and electroplate a contact or bump 12 so that it protrudes beyond surface 30 in the form of a contact as desired. Alternately, as an example, one may start with polyimide film, sputter deposit a thin film adhesion metal such as chrome to surface 32, sputter deposit copper in a thin film to the adhesion layer, and use a process of photoresist to define and selectively plate traces 18 and 26. Vias 34 may then be etched as previously discussed, and a connection through each via 34 as well as contacts 12 may then be selectively plated.

In a preferred embodiment of flexible sheet 10, thin film conductors 18 connected to contacts 12 have a width dimension which has a predetermined relationship to the thickness dimension of flexible sheet 10 and each conductor is associated with a ground plane formed of a metal thin film opposite this conductor on the other side of sheet 10 so that thin film conductors 18 have a predetermined characteristic impedance.

In this manner, it is possible, for example, to configure a system in which the characteristic impedance of test circuit 20 and/or inputs and outputs 16 on device 14 may be maintained for substantially the entire distance between test circuit 20 and contacts 16 on device 14 being tested.

In addition, a preferred embodiment of flexible sheet 10 may comprise grounded conductors interspaced between conductors 18 in order to substantially eliminate the cross-talk between conductors 18 connected to contacts 12.

FIG. 2 illustrates a test circuit 20 and flexible sheet 10 in accordance with the present invention arranged for testing a semiconductor device 14. The interface shown includes apparatus 38 comprising a lower portion 54 for holding flexible sheet 10 in position while a chuck or other movable device 40 is used to position semiconductor device 14 for testing a particular die or chip 14. (While fixture portions 38 and 54 may also be movable, it is more typical to move chuck 40).

Flexible sheet 10 is typically comprised of a transparent or semitransparent dielectric such as polyimide or other polymeric film so that the position of contacts 12 can be visually aligned with contacts 16 on die or chip 14 by viewing the alignment through the window 42 in upper portion 38.

Test circuit 20, chuck 40, and other apparatus typically associated with integrated circuit testers are typically employed in conjunction with the present invention. Such apparatus are commonly found in commercially available integrated circuit testers such as the Fairchild Series 20 tester, the sentry 21 tester, the Teradyne Model A300 family of integrated circuit testers, and the Tektronics 3200 series of testers.

The present interface comprises apparatus 50 for flexing flexible sheet 10 so that contacts 12 and 16 on both sheet 10 and semiconductor device 14 respectively may be brought into intimate contact. Apparatus 50 in the embodiment shown comprises an air chamber 50 between window 42 and the portion of flexible sheet 10 comprising conductors 12. A fluid pressure channel 52 is connected to chamber 50 for applying a fluid or air pressure to chamber 50 for flexing flexible sheet 10 to bring contacts 12 and 16 into intimate contact.

The present interface also comprises apparatus for preforming into a generally domed shape a portion of sheet 10 which includes a plurality of contacts 12. The generally domed portion of sheet 10 which comprises contacts 12 protrudes through an opening in lower surface 62 of the fixture. Preforming the portion of sheet 10 comprising contacts 12 into a generally domed shape has two primary advantages. The domed shape places contacts 12 well outside the bottom of lower surface 62 so that lower surface 62 can be kept well away from the semiconductor device 14 being tested. This is particularly important when a wafer comprising a plurality of die 14 is being tested so that contacts 12 may be appropriately positioned over each die 14 of interest without risking contact with the remainder of the wafer.

In addition, preforming into a generally domed shape the portion of flexible sheet 10 comprising contacts 12 also provides a scrubbing action when contacts 12 are brought into intimate contact with contacts 16. The present interface is typically used by aligning contacts 12 and 16 and then raising chuck 40 so that contacts 12 and 16 are in contact. Air or other fluid pressure (air generally being preferred) is then typically put into chamber 50 so that contacts 12 and 16 are brought into intimate contact. This process of bringing contacts 12 and 16 into intimate contact includes flexing of the generally domed portion of flexible sheet 10 which provides a scrubbing motion between contacts 12 and 16. This helps assure intimate contact between contacts 12 and 16 by scrubbing away with contacts 12 a thin oxide layer which typically forms on contacts 16.

Any variety of means may be used to preform flexible sheet 10 into a generally domed shape. In the apparatus shown, the fixture comprises an upper portion 38 and a lower portion 54 which fit together. In the embodiment shown lower portion 54 comprises a conical surface 60 which may be formed by a surface 60 which is machined flat at an angle 58 from the horizontal. Angle 58 may vary to any desired angle; however, 7.5 degrees has been found to be satisfactory. Flexible sheet 10 lays on conically shaped surface 60 which is shown lying outside of the area covered by pressure chamber 50. Surface 60 may be flat as previously indicated rather than of a domed shape. Upper portion 38 may comprise a similar flat surface with a matching angle 58 and fitting up against the upper portion of flexible sheet 10 or, as illustrated, may comprise only a short interface 68 adjacent chamber 50 and contacting flexible sheet 10 only on the portion immediately surrounding edge 66 of the opening in lower surface 62.

Holding flexible sheet 10 down onto angled surface 60 will result in flexible sheet 10 being of a generally domed shape for that portion of the sheet which projects through the opening in surface 62.

Lower surface 62 of lower fixture portion 54 is typically machined at a slight angle 64 from opening edge 66 upward from the horizontal to provide further clearance between the fixture and wafer or chip 14 under test. An angle 64 which has been found to be satisfactory is 2 degrees.

Flexible sheet 10 may be positioned in the fixture using reference apertures 70 which fit over pins (not shown) in the fixture. Conductors 18 as illustrated in FIG. 3 comprise end portions 72 which are slightly enlarged over the width of traces 18. These end portions 72 are contact areas positioned for mating with electrical contacts 46 held in position by upper fixture portion 38, electrical contacts 46 being connected by conductor 44 to test circuit 20. Contacts 46 may be of any desired type; the conductors 46 illustrated in the drawings comprise a spring-loaded central conductor 47 which contacts end portion or contact area 72 of conductors 18 for making a continuous electrical path between test circuit 20, conductors 44 and conductors 18. Conductor 18A shown running to the center of flexible sheet 10 may be used in conjunction with an edge or depth sensor which may be a contact similar to 46 running through the center of the fixture and positioned to close contact with conductor 18A when flexible sheet 10 is raised to a sufficient height by an underlying semiconductor device 14. Accordingly, conductor 18A, which is typically exposed above surface 30 of flexible sheet 10, may be used in conjunction with an edge sensor to determine when contacts 12 on flexible sheet 10 have been appropriately contacted by contacts 16 of semiconductor device 14 when device 14 is positioned by chuck 40.

A flexible sheet in accordance with the present invention may comprise a matrix array of contacts 12, the contacts being patterned to mate with a matrix array of contacts on an integrated circuit device. An array of contacts is typically used in testing high density VLSI circuits.

The present invention is to be limited only in accordance with the scope of the appended claims since persons skilled in the art may devise many variations of the embodiments disclosed herein while still being within the limits of the claims. For example, conductors 18 on flexible sheet 10 may be located on both sides of sheet 10.

The embodiments of the invention in which an exclusive property or right is claimed are defined as follows:

1. An interface structure for testing a selected integrated circuit device through a plurality of contacts on an exposed surface of the device, the interface structure comprising:
    a flexible sheet having first and second opposing surfaces;
    a plurality of electrical contacts protruding beyond the first surface of the sheet in a pattern designed to mate with a plurality of contacts on a selected integrated circuit device;
    a plurality of thin film conductors disposed on and adhering to the sheet in a pattern, the conductors each being connected to at least one of the contacts on the sheet and being adapted for electrical connection to permit making such a connection to a circuit for testing the device;
    means for preforming into a generally domed shape at least a portion of the sheet which includes thereon at least one of the contacts with the first surface of the flexible sheet including the convex surface of the domed shape; and
    means for flexing the flexible sheet so that the contacts on both the sheet and the device may be brought into initmate contact.

2. The apparatus of claim 1 wherein the conductors connected to the contacts on the sheet are disposed in a pattern on the second surface of the sheet.

3. The apparatus of claim 2 wherein the flexible sheet is substantially transparent to permit viewing the alignment of the contacts on the sheet with the contacts on the device.

4. The apparatus of claim 3 wherein the means for flexing the flexible sheet comprises means for applying a fluid pressure to the flexible sheet.

5. The apparatus of claim 4 wherein the means for applying a fluid pressure to the sheet comprises means for applying air pressure to the sheet.

6. The apparatus of claim 1 wherein the flexible sheet is substantially transparent to permit viewing the alignment of the contacts on the sheet with the contacts on the device.

7. The apparatus of claim 6 wherein the means for flexing the flexible sheet comprises means for applying a fluid pressure to the flexible sheet.

8. The apparatus of claim 7 wherein the means for applying a fluid pressure to the sheet comprises means for applying air pressure to the sheet.

9. The apparatus of claim 1 wherein the means for flexing the flexible sheet comprises means for applying a fluid pressure to the flexible sheet.

10. The apparatus of claim 9 wherein the means for applying a fluid pressure to the sheet comprises means for applying air pressure to the sheet.

11. The apparatus of claim 1 wherein the means for preforming into a generally domed shape comprises a support for the flexible sheet having a recess with a conically shaped surface and having an opening through the support at the apex of this surface.

12. The apparatus of claim 11 wherein the means for preforming into a generally domed shape further comprises a recess insert, having a conically shaped surface similar to that of the recess in the support, is enclosed in the recess of the support with the flexible sheet therebetween to preform this sheet into a generally domed shape.

* * * * *